United States Patent
Kuroda (12)

(10) Patent No.: US 11,683,920 B2
(45) Date of Patent: Jun. 20, 2023

(54) COMPONENT MOUNTING LINE

(71) Applicant: FUJI CORPORATION, Chiryu (JP)

(72) Inventor: Hideya Kuroda, Toyota (JP)

(73) Assignee: FUJI CORPORATION, Chiryu (JP)

( * ) Notice: Subject to any disclaimer, the term of this patent is extended or adjusted under 35 U.S.C. 154(b) by 579 days.

(21) Appl. No.: 16/757,036

(22) PCT Filed: Nov. 6, 2017

(86) PCT No.: PCT/JP2017/039927
§ 371 (c)(1),
(2) Date: Apr. 17, 2020

(87) PCT Pub. No.: WO2019/087391
PCT Pub. Date: May 9, 2019

(65) Prior Publication Data
US 2020/0253101 A1 Aug. 6, 2020

(51) Int. Cl.
*H05K 13/04* (2006.01)
*H05K 13/08* (2006.01)

(52) U.S. Cl.
CPC ..... *H05K 13/0452* (2013.01); *H05K 13/0882* (2018.08)

(58) Field of Classification Search
CPC .............. H05K 13/0452; H05K 13/0882
USPC ....................... 29/740, 739, 700
See application file for complete search history.

(56) References Cited

FOREIGN PATENT DOCUMENTS

| WO | WO-2016013107 A1 * | 1/2016 | ............. B65G 65/00 |
| WO | WO 2016/035145 A1 | 3/2016 | |
| WO | WO-2016035145 A1 * | 3/2016 | ......... H05K 13/0069 |

OTHER PUBLICATIONS

International Search Report dated Jan. 23, 2018 in PCT/JP2017/039927 filed on Nov. 6, 2017.

* cited by examiner

*Primary Examiner* — Peter Dungba Vo
*Assistant Examiner* — Azm A Parvez
(74) *Attorney, Agent, or Firm* — Oblon, McClelland, Maier & Neustadt, L.L.P.

(57) ABSTRACT

An automatic exchanging device is provided which moves alongside the front face of a component mounting line. When an automatic exchange request for a feeder is generated in any of multiple component mounting machines constituting the component mounting line, the automatic exchanging device moves to the front of the component mounting machine in which the automatic exchange request was generated to automatically exchange the feeder. When a new automatic exchange request is generated in any one of the component mounting machines, a pull-out operation of a predetermined number of component mounting machines is prohibited, from the component mounting machine facing the automatic exchanging device toward the position of the component mounting machine in which the new automatic exchange request was generated.

12 Claims, 11 Drawing Sheets

COMPONENT MOUNTING LINE

TECHNICAL FIELD

The present specification discloses a technique related to a component mounting line having an automatic exchanging device for automatically exchanging (i.e., setting and/or removing) feeders with feeder setting bases of multiple component mounting machines arranged along a conveyance path of a circuit board.

BACKGROUND ART

Recently, as described in Patent Literature 1 (International Publication WO2016/035145), an automatic exchanging device (exchanging robot) is installed in a movable manner in a moving lane provided alongside an arrangement of multiple component mounting machines constituting a component mounting line, wherein the automatic exchanging device is moved to the front of a component mounting machine at which an automatic exchange request has been generated and automatically exchanges a feeder with the feeder setting base of the component mounting machine.

In general, in a component mounting line, when a problem or the like occurs in any one of the component mounting machines, an operator can pull out the component mounting machine to the front side of the component mounting line to perform an inspection, adjustment, or the like. Further, the operator can pull out the feeder setting base of any component mounting machine forward to check and adjust the set state of the feeder and/or exchange the feeder setting base.

PATENT LITERATURE

Patent Literature 1: International Publication WO2016/035145

BRIEF SUMMARY

Technical Problem

When any problem occurs in any component mounting machine or any problem occurs in a setting state of a feeder on a feeder setting base during operation (manufacturing) of the component mounting line, the operator may pull out the component mounting machine to the front side of the component mounting line or pull out the feeder setting base from a component mounting machine to perform an inspection, adjustment, or the like.

However, since the automatic exchanging device moves along the front face of the component mounting line and passes the front face side of each component mounting machine, if the operator pulls out any component mounting machine to the front face side of the component mounting line or pulls out a feeder setting base from a component mounting machine during operation of the component mounting line, these pulled out component mounting machine or feeder setting base protrude into the moving area of the automatic exchanging device. Therefore, there is a possibility that the moving automatic exchanging device will interfere with a pulled-out component mounting machine or feeder setting base.

Solution to Problem

In order to solve the above-mentioned problem, the present disclosure provides a component mounting line, in which multiple component mounting machines are arranged along a conveyance path of a circuit board, and components, being supplied from a feeder setting base of each component mounting machine, are mounted on the circuit board by the multiple component mounting machines, the component mounting line comprising: an automatic exchanging device, moving alongside the front face of the component mounting line in the arrangement direction of the multiple component mounting machines, which sets and/or removes the feeder to and/or from the feeder setting base of each component mounting machine, in which the automatic exchanging device is configured to set and/or remove the feeder by moving to a front of the component mounting machine at which an automatic exchange request for setting and/or removing the feeder is generated, when the automatic exchange request is generated to any of the multiple component mounting machines, so that each component mounting machine and/or the feeder setting base is configured to enable an operator to pull out the component mounting machine and/or feeder setting base toward the front face side of the mounting line, and a pull-out operation prohibiting section configured to prohibit the pull-out operation of a predetermined number of component mounting machines, from the component mounting machine facing the automatic exchanging device toward a position of a component mounting machine at which a new automatic exchange request has been generated, when the new automatic exchange request is generated in any of the multiple component mounting machines.

In this configuration, when a new automatic exchange request is generated in any of the multiple component mounting devices constituting the component mounting line, the pull-out operation is prohibited for the predetermined number of component mounting machines, from the component mounting machine facing the automatic exchanging device toward the position of the component mounting machine in which the new automatic exchange request was generated so that the pull-out operation by an operator is automatically prohibited for a predetermined number of component mounting machines which the automatic exchanging device passes, and interference between the moving automatic exchanging device, the component mounting machine, and the feeder setting base can be prevented in advance.

In this case, the predetermined number of component mounting machines whose pull-out operation is prohibited by the pull-out operation prohibiting section may be all component mounting machines in the range from the component mounting machine facing the automatic exchanging device to the component mounting machine in which the new automatic exchange request was generated.

Alternatively, the predetermined number of component mounting machines in which pull-out operations are prohibited by the pull-out operation prohibiting section may be a predetermined constant number of component mounting machines.

DESCRIPTION OF EMBODIMENTS

Figure 1:
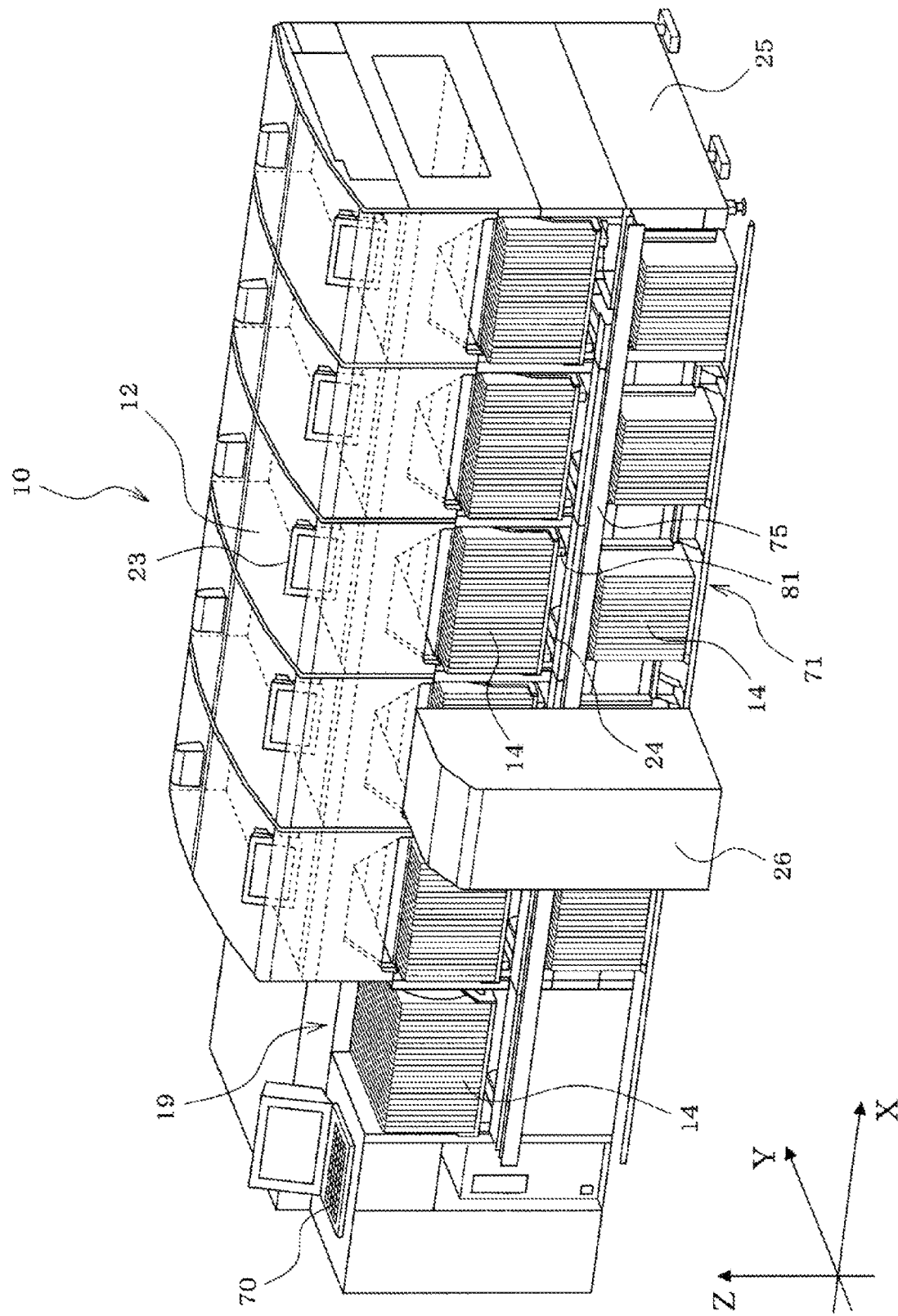
FIG. 1 is a perspective view showing a configuration of the entire component mounting line of Embodiment 1.

Hereinafter, two embodiments, embodiments 1, 2, will be described.

Embodiment 1

Embodiment 1 will be described with reference to FIGS. 1 to 8.

First, a configuration of component mounting line 10 will be described with reference to FIGS. 1 to 4.

Component mounting line 10 is configured by arranging multiple component mounting machines 12 in a row along the conveyance direction (i.e., the X-direction) of circuit board 11, and a solder printing machine (not shown) for printing solder on circuit board 11, feeder storage device 19 for storing cassette-type feeders 14, and the like are installed on the side of component mounting line 10 to which boards are loaded.

Figure 2:
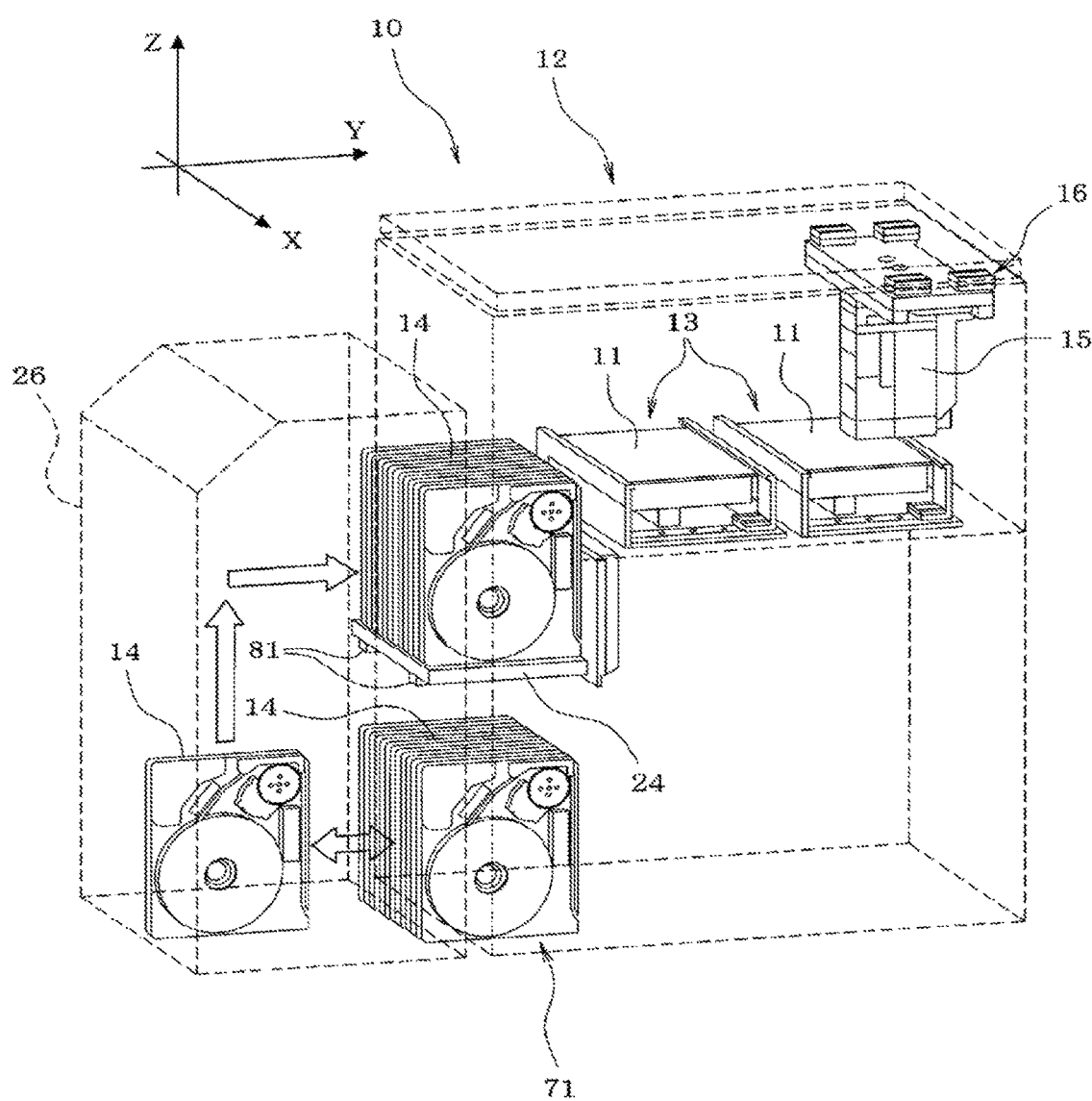
FIG. 2 is a perspective view schematically showing a configuration of an automatic exchanging device and a component mounting machine.
Figure 3:
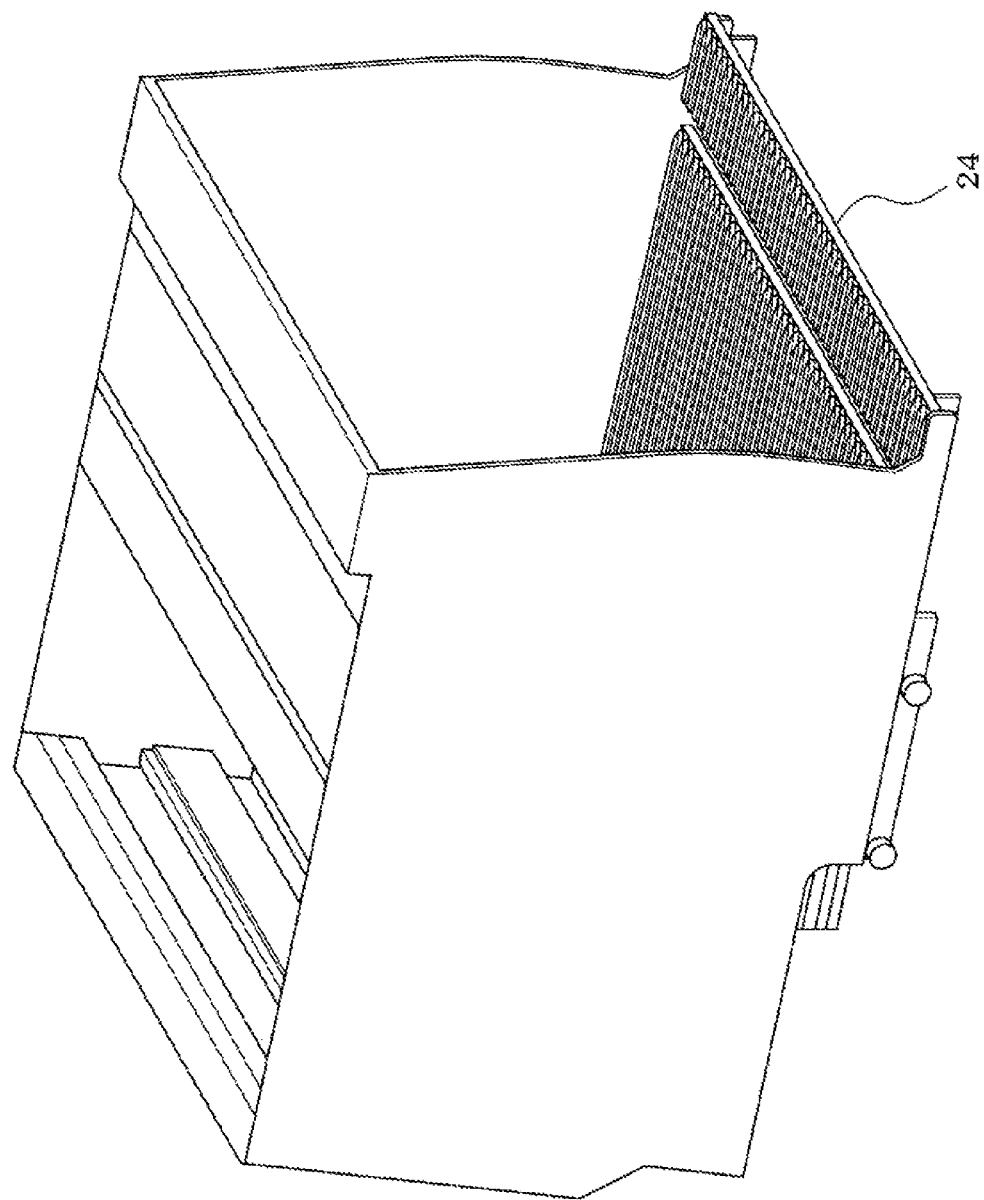
FIG. 3 is a perspective view showing a feeder setting base.

As shown in FIG. 2, each component mounting machine 12 is provided with two conveyors 13 for conveying circuit board 11, feeder setting base 24 (see FIGS. 1 and 3) for exchangeably setting multiple cassette-type feeders 14, mounting head 15 for holding suction nozzles (not shown) for picking up components supplied from cassette-type feeders 14 set on feeder setting base 24 and mounting the components on circuit board 11, head moving device 16 for moving mounting head 15 in the XY-direction (i.e., left, right, forward, and rearward directions), component imaging camera 17 (see FIG. 4) for imaging the components picked up by the suction nozzles from below, and the like. Mark imaging camera 18 (see FIG. 4) for imaging a reference mark (not shown) of circuit board 11 is attached to head moving device 16 so as to move integrally with mounting head 15 in the XY-direction.

Figure 4:
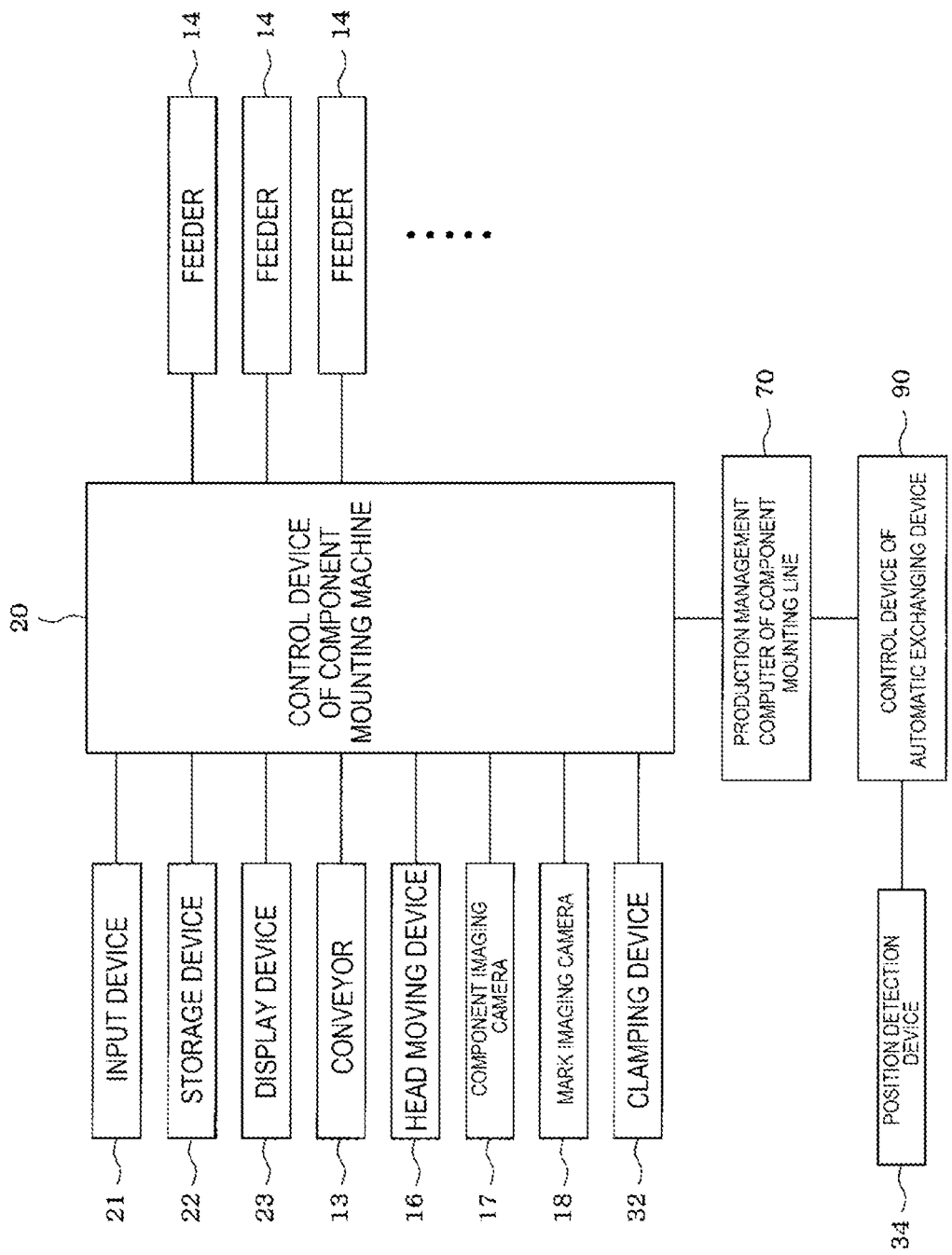
FIG. 4 is a block diagram schematically showing a configuration of a control system of the component mounting line having an automatic exchanging device.

In addition, as shown in FIG. 4, input device 21 such as a keyboard, a mouse, or a touch panel, storage device 22 such as a hard disk, RAM, or ROM for storing various programs for controlling, various data, and the like, display device 23 such as a liquid crystal display, a CRT, or the like are connected to control device 20 of component mounting machine 12. Control device 20 of each component mounting machine 12 is connected to production management computer 70, which manages production of the entire component mounting line 10 via a network.

Each component mounting machine 12 of component mounting line 10 conveys circuit board 11 conveyed from component mounting machine 12 on the upstream side to a predetermined position with conveyor 13, clamps and positions circuit board 11 with a clamping mechanism (not shown), images the reference mark of circuit board 11 with mark imaging camera 18, and recognizes the position of the reference mark (i.e., a reference position of circuit board 11) and moves the component supplied from feeder 14 from the suction nozzle of mounting head 15 to an imaging position, moves the component from the suction position to the imaging position, images the component from below with component imaging camera 17, determines the suction position shift amount of the component, moves mounting head 15 to correct the suction position shift amount, and then mounts the component on circuit board 11, which is on conveyor 13, to produce the component mounting board.

As shown in FIG. 1, automatic exchanging device 26 for setting and/or removing feeder 14 to and from feeder setting base 24 of each component mounting machine 12 (hereinafter referred to as "automatic exchange") is installed on the front face side of component mounting line 10. Below feeder setting base 24 of each component mounting machine 12, stock section 71 for accommodating multiple feeders 14 to be set in feeder setting base 24 is provided. When an automatic exchange request of any of multiple component mounting machines 12 constituting component mounting line 10 is generated, automatic exchanging device 26 moves to component mounting machine 12 in which the automatic exchange request of feeder 14 was generated, takes out feeder 14 to be exchanged from feeder setting base 24 of component mounting machine 12 in question and collects it in stock section 71, and then takes out the necessary feeder 14 from stock section 71 and sets it in feeder setting base 24. Incidentally, depending on the automatic exchange request, there are cases in which automatic exchanging device 26 performs only the operation of collecting feeder 14 taken out from feeder setting base 24 in stock section 71 or, in reverse, there are cases in which automatic exchanging device 26 performs only the operation of setting feeder 14 taken out from stock section 71 to the empty slot of feeder setting base 24.

On the front face side of component mounting line 10, guide rail 75 for moving automatic exchanging device 26 in the X-direction alongside the arrangement of component mounting machines 12 is provided so as to extend in the X-direction over the entire component mounting line 10. The side of guide rail 75 that is on the board loading side of mounting line 10 extends to feeder storage device 19, enabling automatic exchanging device 26 to move to the front of feeder storage device 19 so that automatic exchanging device 26 can take out feeders 14 needed for automatic exchanging from feeder storage device 19 and return used feeders 14 into feeder storage device 19.

Automatic exchanging device 26 has a position detection device 34 (see FIG. 4) for detecting the position of automatic exchanging device 26 with respect to component mounting line 10. When an automatic exchange request is generated in any one of component mounting machines 12, control device 90 of automatic exchanging device 26, while detecting the position of automatic exchanging device 26 based on the detection signal of position detection device 34, moves automatic exchanging device 26 to component mounting machine 12 in which the automatic exchange request was generated, and causes automatic exchanging device 26 to perform automatic exchange of feeder 14.

Although not shown in any of the drawings, in addition to automatic exchanging of feeders 14, automatic exchanging device 26 can also automatically exchange cassette-type nozzle exchange sections accommodating suction nozzles for exchanging, cassette-type calibration component supply sections supplying calibration components, and the like with feeder setting base 24.

Production management computer 70 monitors whether an automatic exchange request has been generated in any of multiple component mounting machines 12 constituting component mounting line 10 during production, and when an automatic exchange request generated in any of component mounting machines 12, the information is transmitted to control device 90 of automatic exchanging device 26 to cause automatic exchanging device 26 to move to the front of component mounting machine 12 in which the automatic exchange request was generated. Alternatively, control device 90 of automatic exchanging device 26 may be made to acquire information of component mounting machine 12 in which an automatic exchange request is generated directly from component mounting machine 12 in question via the network, and automatic exchanging device 26 may then move to the front of component mounting machine 12 in question.

feeder setting base 24 of each component mounting machine 12 is attached in a manner that enables feeder setting base 24 to be pulled forward and exchanged, and feeder setting base 24 attached to each component mounting machine 12 can be pulled forward by an operator to check and adjust the set state of feeder 14 and exchange feeder setting base 24. Further, each component mounting machine 12 is provided with clamping device 32 (see FIG. 4) for clamping feeder setting base 24 into a fully-set state. The operation of pulling out feeder setting base 24 performed by the operator is an operation of releasing the clamp of clamping device 32 and pulling out feeder setting base 24 forward from component mounting machine 12, and the operation of releasing the clamp of clamping device 32 is performed by the operator operating input device 21 of component mounting machine 12, another computer (not shown) such as production management computer 70 connected to component mounting machine 12 via a network, a portable terminal (not shown), or the like. The clamp release operation of clamping device 32 releases the clamped state of feeder setting base 24 with respect to component mounting machine 12, causing feeder setting base 24 to slightly protrude from component mounting machine 12 by the reaction of the clamp release operation, after which the operator can manually pull out feeder setting base 24.

Multiple component mounting machines 12 constituting component mounting line 10 are installed on base 25 (see FIG. 1) of component mounting line 10 such that component mounting machines 12 can be pulled out. Base 25 of component mounting line 10 is provided with a pushing device (not shown) for pushing out component mounting machine 12 forward by a predetermined amount from the fully-set state by the pull-out operation of the operator. The pushing device also functions as a clamping device which operates using, for example, an air cylinder or the like as a driving source and clamps the component mounting machine 12 into the fully-set state. The pull-out operation of component mounting machine 12, similarly to the pull-out operation of feeder setting base 24, is performed by causing the pushing device to operate by operating input device 21 of component mounting machine 12, another computer (not shown) such as production management computer 70 connected to component mounting machine 12 via a network, a portable terminal (not shown), or the like. After component mounting machine 12 is pushed forward by a predetermined amount by the pushing device, the operator can manually pull out component mounting machine 12.

Incidentally, when any problems occur in any of component mounting machines 12 or any problems occur in the set state of feeder 14 on feeder setting base 24 during operation of component mounting line 10, the operator may pull out component mounting machine 12 in question to the front face side of component mounting line 10 or pull out feeder setting base 24 from component mounting machine 12 in question to perform an inspection, adjustment, or the like.

However, since automatic exchanging device 26 moves alongside the front face of component mounting line 10 and passes the front face side of each component mounting machine 12 during operation of component mounting line 10, if an operator pulls out any component mounting machine 12 to the front face side of component mounting line 10 or pulls out feeder setting base 24 from component mounting machine 12 during operation of component mounting line 10, the pulled out component mounting machine 12 or feeder setting base 24 will protrude into the moving region of automatic exchanging device 26, and therefore, there is a possibility that the pulled out component mounting machine 12 or feeder setting base 24 will interfere with automatic exchanging device 26 which moves.

As a countermeasure to this, when a new automatic exchange request is generated in any of multiple component mounting machines 12 constituting component mounting line 10, the pull-out operation of component mounting machine 12 and feeder setting base 24 is prohibited for a predetermined number of component mounting machines 12, from the component mounting machine 12 facing automatic exchanging device 26 toward the position of component mounting machine 12 in which the new automatic exchange request was generated.

Figure 5:
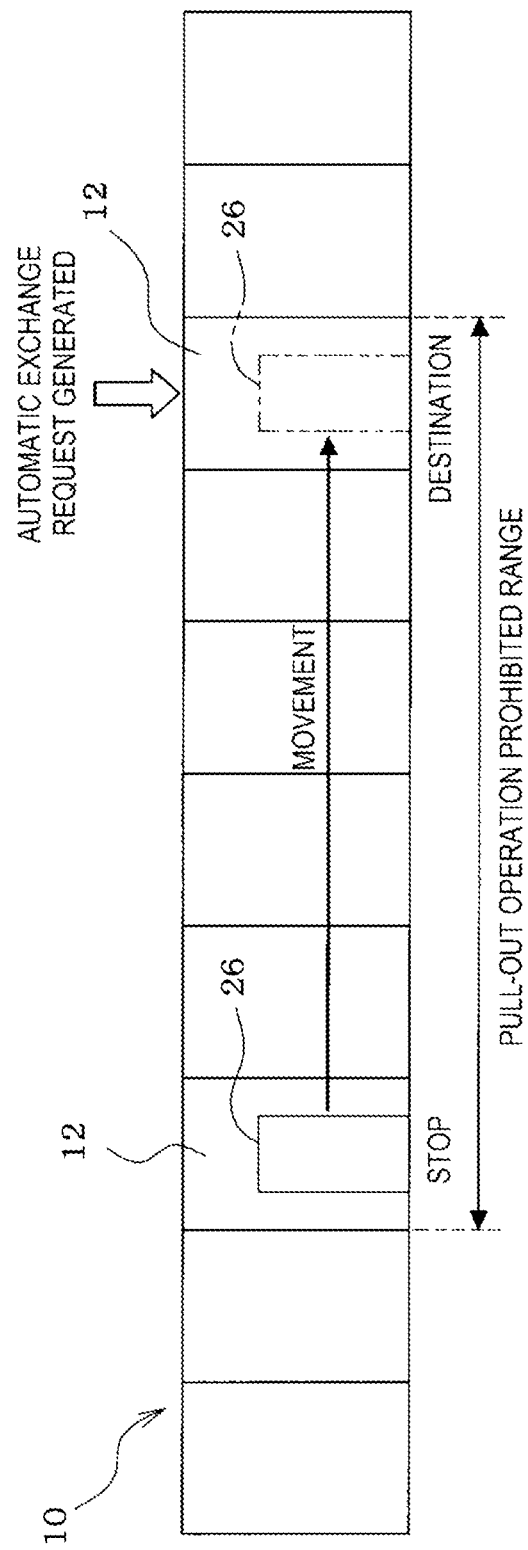
FIG. 5 is a diagram showing a first example of a range of component mounting machines in which pull-out operations are prohibited in the first embodiment

In the first embodiment, as shown in FIG. 5, the predetermined number of component mounting machines 12 whose pull-out operation is prohibited are all component mounting machines 12 in the range from component mounting machine 12 facing automatic replacing device 26 to component mounting machine 12 in which the new automatic exchange request was generated.

Figure 6:
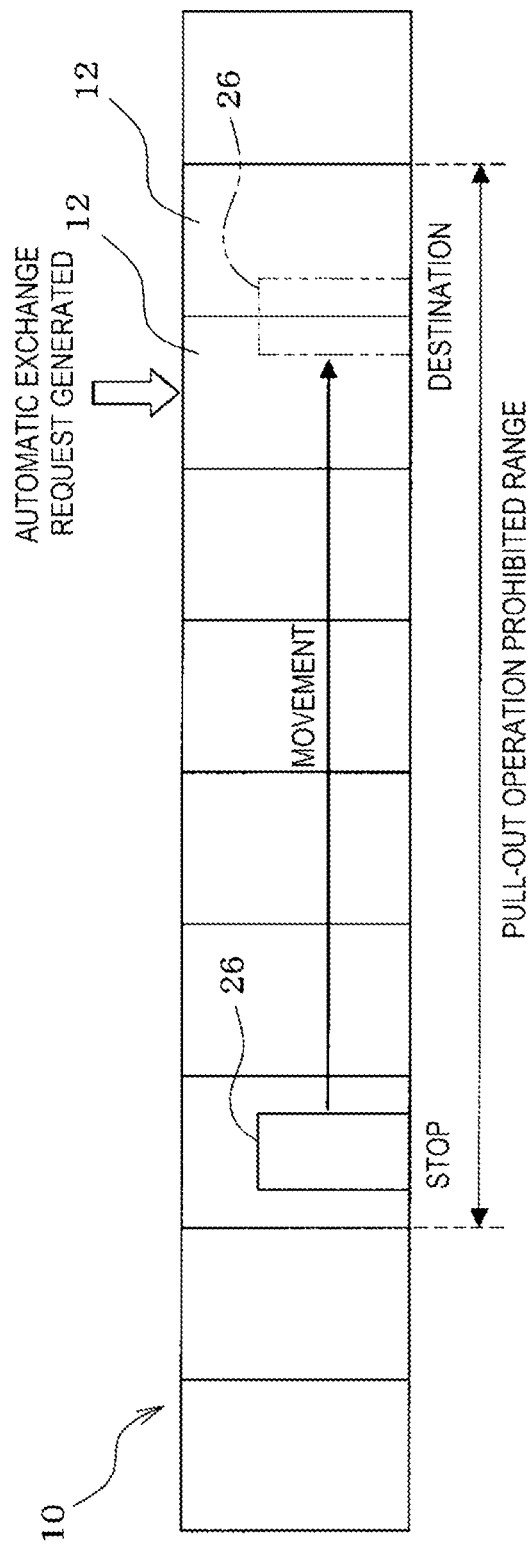
FIG. 6 is a diagram showing a second example of a range of component mounting machines in which pull-out operations are prohibited in the first embodiment.

Further, in the first embodiment, when automatic exchanging device 26 moves to the front of component mounting machine 12 in which a new automatic exchange request was generated to perform an automatic exchange of feeder 14, as shown in FIG. 6, in the case in which a portion of automatic exchanging device 26 protrudes to the front of an adjacent component mounting machine 12, the pull-out operation of the adjacent component mounting machine 12 is also prohibited.

Here, "pull-out operation prohibition" means that the operator holds component mounting machine 12 and feeder setting base 24 in a state in which a pull-out operation cannot be performed and specifically, even if the operator operates input device 21 of component mounting machine 12, another computer (not shown) such as production management computer 70, or a portable terminal (not shown) to input a pull-out operation signal, the input of the pull-out operation signals are invalidated, or the pull-out operation signal is held in a state in which the pull-out operation signal cannot be inputted (for example, a state in which the operating screen of the pull-out operation cannot be switched), which prohibits both the clamp release operation of clamping device 32 and the push-out operation of the pushing device, thereby prohibiting the pull-out operation of both component mounting machine 12 and feeder setting base 24.

Further, in the first embodiment, a warning display indicating the prohibition of a pull-out operation is displayed on display device 23 of component mounting machine 12 to which a pull-out operation is prohibited, or the sound output device (not shown) of component mounting machine 12 outputs a warning sound indicating the prohibition of the pull-out operation, thereby providing the operator with information indicating the prohibition of the pull-out operation.

Figure 7:
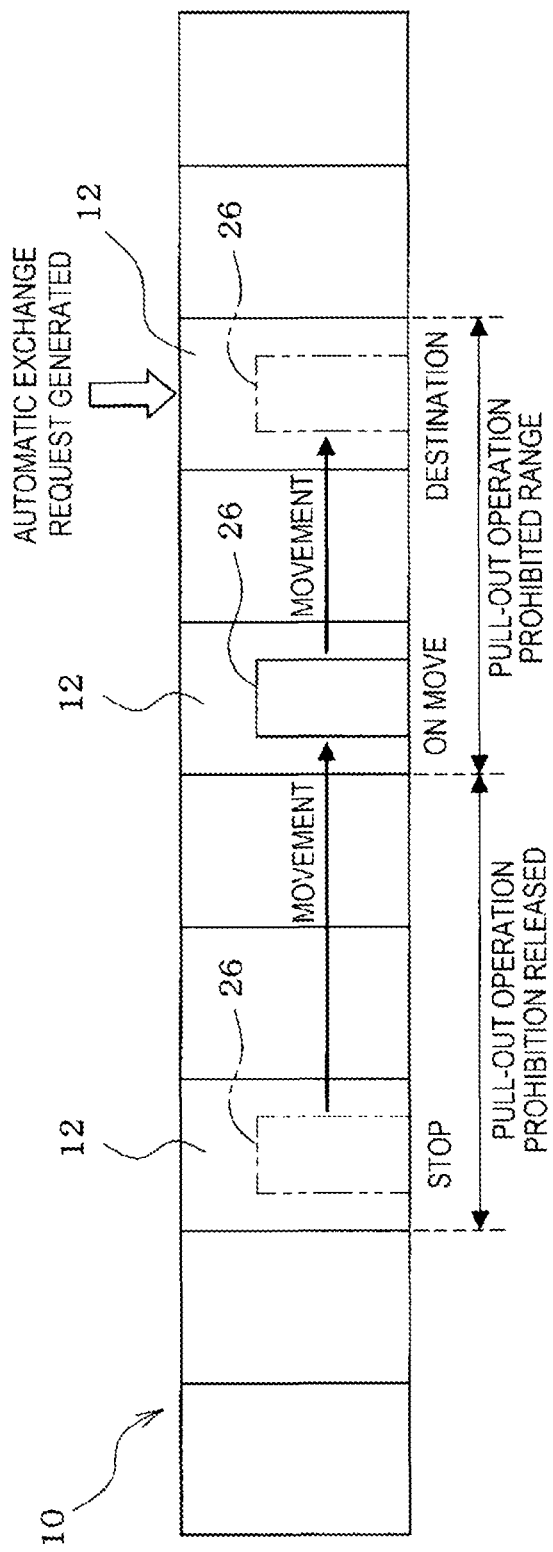
FIG. 7 is a diagram showing a third example of a range of component mounting machines in which pull-out operations are prohibited in the first embodiment.

Further, as shown in FIG. 7, after the automatic exchanging device 26 passes in front of the component mounting machine 12 in which the pull-out operation is prohibited, the prohibition of the pull-out operation on the component mounting machine 12 is released and the pull-out operation is permitted.

When automatic exchanging device 26 stops, pull-out operations of component mounting machine 12 facing automatic exchanging device 26 are prohibited. In this situation in which automatic exchanging device 26 stops at a position straddling two component mounting machines 12 (that is, when automatic exchanging device 26 stops with facing two component mounting machines 12 being adjacent to each other), the pull-out operations of the two component mounting machines 12 are prohibited. This is because a portion of automatic exchanging device 26 may stop in a state of protruding in front of component mounting machine 12, performing an automatic exchange, and in front of component mounting machine 12 next thereto, when automatic exchanging device 26 performs an automatic exchange of feeder 14 for the slot being provided at the end of feeder setting base 24.

Figure 8:
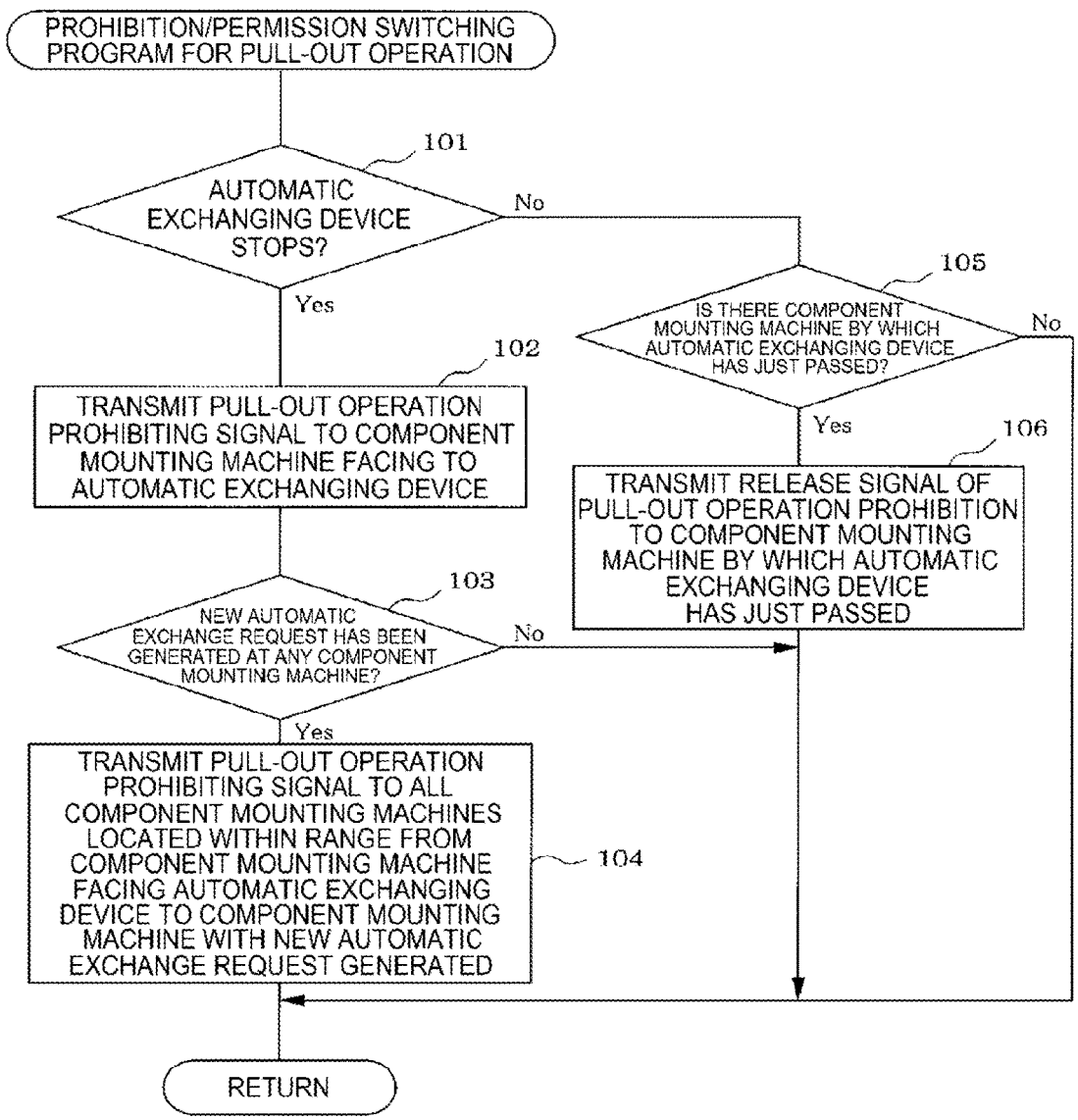
FIG. 8 is a flowchart showing the flow of processes in a pull-out operation prohibition/permission switching program of the first embodiment.

The switching of prohibition/permission (i.e., release prohibition) of the pull-out operation in the first embodiment described above is executed by production management computer 70 during the operation of component mounting line 10 in accordance with the pull-out operation prohibition/permission switching program of FIG. 8. The processing content of the pull-out operation prohibition/permission switching program of FIG. 8 will be described below.

The pull-out operation prohibiting/permitting switching program shown in FIG. 8 is repeatedly executed by production management computer 70 at a predetermined cycle during the operation of component mounting line 10, and functions as a pull-out operation prohibiting section that prohibits the pull-out operation for a predetermined number of component mounting machines 12 in cooperation with control device 20 of each component mounting machine 12.

Production management computer 70, when starting the present program, first in step 101 determines whether automatic exchanging device 26 stops on the basis of a signal transmitted from control device 90 of automatic exchanging device 26, and if automatic exchanging device 26 stops, the process proceeds to step 102, and production management computer 70 transmits a pull-out operation prohibiting signal to control device 20 of component mounting machine 12 facing automatic exchanging device 26, As a result, control device 20 of component mounting machine 12 facing automatic exchanging device 26 executes the action of prohibiting the pull-out operation.

Thereafter, the process proceeds to step 103, where it is determined whether a new automatic exchange request has occurred in any of multiple component mounting machines 12 constituting component mounting line 10. If it is determined that a new automatic exchange request has occurred in any component mounting machines 12, the process proceeds to step 104, and a signal of prohibiting the pull-out operation is transmitted to all component mounting machines 12 in the range from component mounting machine 12 facing automatic exchanging device 26 to component mounting machine 12 in which a new automatic exchange request was generated. As a result, control devices 20 of all component mounting machines 12 in the range prohibit the pull-out operation and terminate the present program.

When automatic exchanging device 26 moves to the front of component mounting section 12 in which a new automatic exchange request has been generated to perform an automatic exchange of feeder 14, as shown in FIG. 6, when a portion of automatic exchanging device 26 protrudes to the front of adjacent component mounting machine 12, a pull-out operation prohibiting signal is also transmitted to the adjacent component mounting machine 12.

If it is determined in step 103 that a new automatic exchange request has not been generated in any component mounting machine 12, the program is terminated as is.

On the other hand, if it is determined in step 101 that automatic exchanging device 26 does not stop, that is, automatic exchanging device 26 is moving, the process proceeds to step 105 where it is determined whether there is a component mounting machine 12 by which automatic exchanging device 26 has just passed. If it is determined that there is a component mounting machine 12 by which automatic exchanging device 26 has just passed, the process proceeds to step 106 where automatic exchanging device 26 transmits a release signal of the pull-out operation prohibition to component mounting machine 12 by which automatic exchanging device 26 has passed, and the present program is terminated. As a result, every time automatic exchanging device 26 passes in front of component mounting machine 12 in which the pull-out operation is prohibited, prohibition of the pull-out operation on that component mounting machine 12 is released. If it is determined in step 106 that there is no component mounting machine 12 by which automatic exchanging device 26 has just passed, the present program is terminated as is.

With the first embodiment described above, when a new automatic exchange request is generated in any of multiple component mounting machines 12 constituting component mounting line 10, the pull-out operation of component mounting machine 12 and feeder setting base 24 is prohibited for all component mounting machines 12 in the range from component mounting machine 12 facing automatic exchanging device 26 to component mounting machine 12 in which the new automatic exchange request was generated so that the pull-out operation by an operator can be automatically prohibited for component mounting machines 12 in the range in which automatic exchanging device 26 moves and interference with moving automatic exchanging device 26 can be prevented in advance.

Further, in the first embodiment, when automatic exchanging device 26 moves to the front of component mounting machine 12 in which a new automatic exchange request has been generated to perform automatic exchange of feeder 14, as shown in FIG. 6, in the case where a portion of automatic exchanging device 26 protrudes to the front of the adjacent component mounting machine 12, the pull-out operation is prohibited for the adjacent component mounting machine 12 so that when a portion of automatic exchanging device 26 protrudes to the front of the adjacent component mounting machine 12, the pull-out operation can also be prohibited for the adjacent component mounting machine 12 and interference between the adjacent component mounting machine 12 and automatic exchanging machine 26 can also be prevented.

Moreover, since prohibition of the pull-out operation for component mounting machine 12 is released and is permitted after automatic exchanging device 26 passes by the front of component mounting machine 12, there is an advantage of being able to quickly perform the work of inspection and adjustment or the like on component mounting machine 12.

Embodiment 2

Next, embodiment 2 will be described with reference to FIGS. 9 to 11. The same reference numerals are assigned to substantially the same portions as those in Embodiment 1 and description thereof is omitted or simplified, and mainly different portions will be described.

Figure 9:
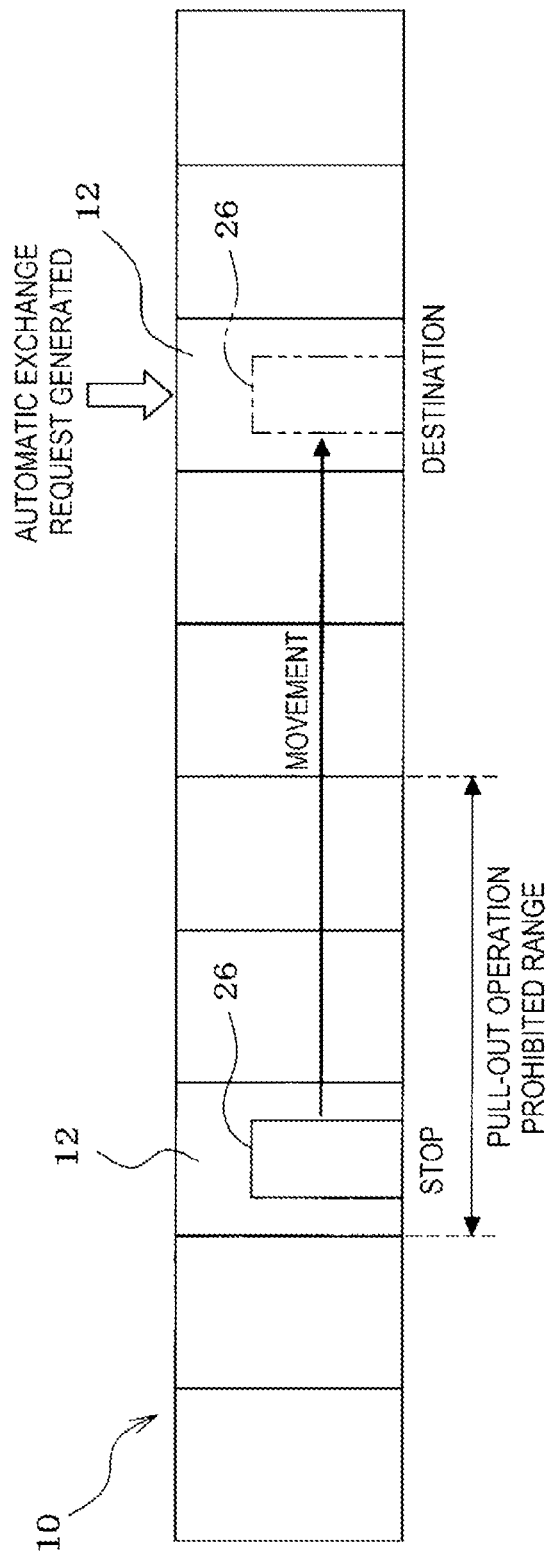
FIG. 9 is a diagram showing a first example of a range of component mounting machines in which pull-out operations are prohibited in a second embodiment.

In the first embodiment described above, when a new automatic exchange request is generated in any of component mounting machines 12, the pull-out operation is prohibited for all component mounting machines 12 in the range from component mounting machine 12 facing automatic exchanging device 26 to component mounting machine 12 in which the new automatic exchange request was generated, but in the second embodiment, as shown in FIG. 9, when a new automatic exchange request is generated in any of component mounting machines 12, the pull-out operation of component mounting machine 12 and feeder setting base 24 is prohibited for a predetermined constant number of component mounting machines 12 (three in the example of FIG. 9), from component mounting machine 12 facing automatic exchanging device 26 toward the position of component mounting machine 12 where a new automatic exchange request was generated.

Figure 10:
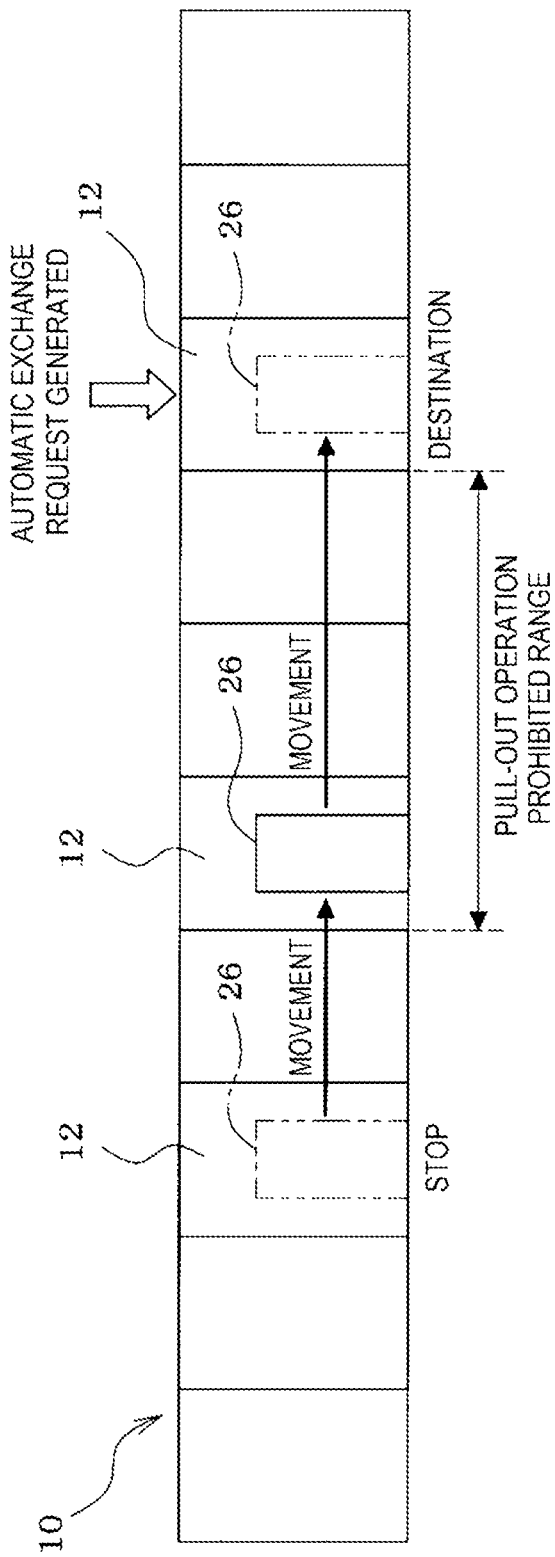
FIG. 10 is a diagram showing a second example of a range of component mounting machines in which pull-out operations are prohibited in the second embodiment.

In this case, every time automatic exchanging device 26 passes by the front of component mounting machine 12, as shown in FIG. 10, the prohibition of the pull-out operation on component mounting machine 12 is released to permit the pull-out operation, and the range of component mounting machines 12, in which the pull-out operation is prohibited, is changed to a range from component mounting machine 12 facing automatic exchanging machine 26 at the time of the release to a predetermined number of component mounting machines 12 toward the moving direction of automatic exchanging machine 26.

Figure 11:
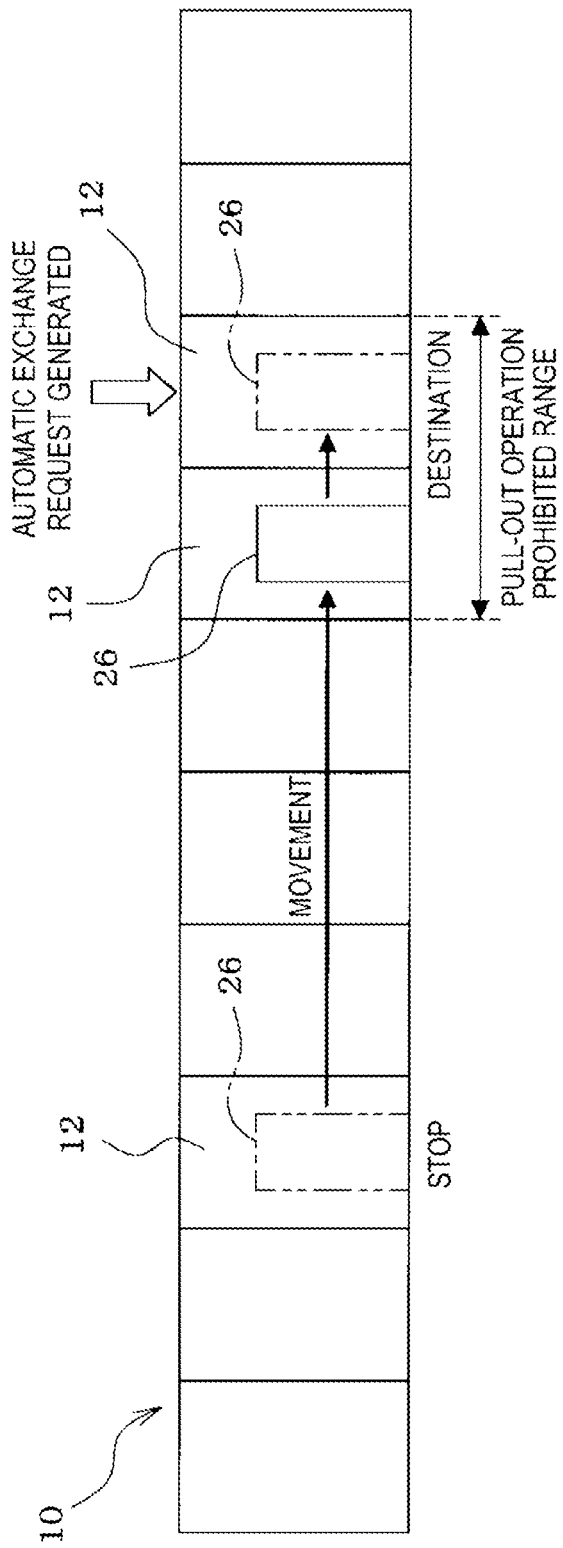
FIG. 11 is a diagram showing a third example of a range of component mounting machines in which pull-out operations are prohibited in the second embodiment.

In this situation, as shown in FIG. 11, in the case that the number of component mounting machines 12 within the range from component mounting machine 12 facing automatic exchanging device 26 to component mounting machine 12 in which a new automatic exchange request has been generated is less than a predetermined constant number, the pull-out operation is not prohibited for component mounting machines 12 at positions beyond the range up to the component mounting machine at which the new automatic exchange request was generated, and the pull-out operation is prohibited within the range up to component mounting machine 12 at which the new automatic exchange request was generated.

However, when automatic exchanging device 26 moves to the front of component mounting machine 12 in which a new automatic exchange request was generated to perform an automatic exchange of feeder 14, in the case that a portion of automatic exchanging device 26 protrudes to the front of the adjacent component mounting machine 12, the pull-out operation of the adjacent component mounting machine 12 is also prohibited.

When automatic exchanging device 26 stops, pull-out operations of component mounting machine 12 facing automatic exchanging device 26 are prohibited. In this situation in which automatic exchanging device 26 stops at a position straddling two component mounting machines 12 (that is, when automatic exchanging device 26 stops with facing two component mounting machines 12 being adjacent to each other), the pull-out operations of the two component mounting machines 12 are prohibited.

The switching of the prohibition/permission (i.e., release prohibition) of the pull-out operation in the second embodiment described above is executed by production management computer 70 in the same manner as in the first embodiment.

Also in the second embodiment described above, the same effect as in the first embodiment can be obtained.

In the above embodiments 1 and 2, although the switching of prohibition/permission (i.e., release prohibition) of the pull-out operation for each component mounting machine 12 (prohibition cancellation) was performed by production management computer 70, control device 20 of each component mounting machine 12 obtains, via a network, position information of automatic exchanging device 26 and information regarding component mounting machine 12 at which an automatic exchange request was generated, and control device 20 of each component mounting machine 12 switches between prohibition/permission the pull-operation by determining the switching time for prohibition/permission and then switches between prohibition/permission accordingly.

In embodiments 1 and 2, pull-out operations are prohibited by prohibiting the clamp release operation of clamping device 32 and the push-out operation of the pushing device, but the pull-out operation may be prohibited by other methods. For example, the pull-out operation can be substantially prohibited by displaying a warning of the pull-out operation prohibition on display device 23 of component mounting machine 12, or by using an audio output device of component mounting machine 12 (not shown) which outputs a warning sound of the pull-out operation prohibition by notifying the operator of information regarding the pull-out operation prohibition.

In addition, the present disclosure is not limited to the configurations of embodiments 1 and 2, and it is needless to say that the present disclosure can gist, such as a configuration in which a pull-out operation can be performed on only one of component mounting machine 12 or feeder setting base 24, the configuration of component mounting line 10 can be changed, the configuration of each component mounting machine 12 can be changed, or the configuration of automatic exchanging device 26 can be changed.

REFERENCE SIGNS LIST

10 . . . Component mounting line, 11 . . . Circuit board, 12 . . . Component mounting machine, 14 . . . Cassette-type feeder, 15 . . . Mounting head, 20 . . . Control device of component mounting machine, 21 . . . Input device, 23 . . . Display device, 24 . . . feeder setting base, 26 . . . automatic exchanging device, 32 . . . Clamping device, 70 . . . Production management computer, 90 . . . Control device of automatic exchanging device

The invention claimed is:

1. A component mounting line, in which multiple component mounting machines are arranged along a conveyance path of a circuit board, and components, being supplied from a feeder setting base of each component mounting machine, are mounted on the circuit board by the multiple component mounting machines, the component mounting line comprising:
- an automatic exchanging device, moving alongside a front face of the component mounting line in an arrangement direction of the multiple component mounting machines, which sets and/or removes a feeder to and/or from the feeder setting base of each component mounting machine,
- in which the automatic exchanging device is configured to set and/or remove the feeder by moving to a front of a component mounting machine of the multiple component mounting machines at which an automatic exchange request for setting and/or removing the feeder is generated,
- in which each of the component mounting machines and/or the feeder setting base of the component mounting machines is configured to enable an operator to pull out the component mounting machine and/or feeder setting base toward a front face side of the component mounting line, and
- a section management computer configured to prohibit a pull-out operation of a predetermined number of the multiple component mounting machines, from the component mounting machine of the component mounting machines facing the automatic exchanging device toward a position of a component mounting machine of the component mounting machines at which a new automatic exchange request has been generated.

2. The component mounting line of claim 1,
wherein the predetermined number of the component mounting machines whose pull-out operation is prohibited by the management computer are all of the component mounting machines in a range from the component mounting machine facing the automatic exchanging device to the component mounting machine in which the new automatic exchange request has been generated.

3. The component mounting line of claim 1,
wherein, when the automatic exchanging device moves to the front of the component mounting machine in which the new automatic exchange request has been generated to set and/or remove a feeder, the management computer prohibits the pull-out operation of an adjacent component mounting machine when a portion of the automatic exchanging device protrudes to the front of the adjacent component mounting machine.

4. The component mounting line of claim 1,
wherein the management computer releases the a prohibition of the pull-out operation of the component mounting machine after the automatic exchanging device passes in front of a component mounting machine in which the pull-out operation is prohibited.

5. The component mounting line of claim 1,
wherein the predetermined number of the component mounting machines in which the pull-out operation is prohibited by the management computer is a predetermined constant number of component mounting machines.

6. The component mounting line of claim 5,
wherein the management computer releases the prohibition of the pull-out operation on the component mounting machine each time the automatic exchanging device passes by the front of the component mounting machine, and changes a range of the component mounting machines with the pull-out operation being prohibited, to a range from a component mounting machine facing the automatic exchanging device at a time of the release to the predetermined number of component mounting machines in a moving direction of the automatic exchanging device.

7. The component mounting line of claim 5,
wherein the management computer does not prohibit the pull-out operation for a component mounting machine at a position beyond a range from the component mounting machine facing the automatic exchanging device to the component mounting machine at which the new automatic exchange request was generated when the number of component mounting machines within the range from the component mounting machine facing the automatic exchanging device to the component mounting machine in which the new automatic exchange request was generated is less than a predetermined constant number.

8. The component mounting line of claim 7,
wherein, when the automatic exchanging device moves to the front of the component mounting machine in which the new automatic exchange request has been generated to set and/or remove the feeder, the management computer prohibits the pull-out operation of an adjacent component mounting machine of the component mounting machines when a portion of the automatic exchanging device protrudes to the front of the adjacent component mounting machine.

9. The component mounting line of claim 1,
wherein the management computer prohibits the pull-out operation of the component mounting machine facing the automatic exchanging device when the automatic exchanging device stops.

10. The component mounting line of claim 1, further comprising:
- a clamp configured to clamp each component mounting machine and/or feeder setting base into a fully-set state,
wherein the management computer, when prohibiting the pull-out operation, prohibits the pull-out operation by prohibiting a clamping release operation of the clamp.

11. The component mounting line of claim 1, further comprising:
- a pusher configured to push out each component mounting machine and/or feeder setting base from a fully-set state by a predetermined amount by a pull-out operation of an operator,
wherein the management computer, when prohibiting the pull-out operation, prohibits a push-out operation of the pusher.

12. The component mounting line of claim 1,
wherein the management computer prohibits the pull-out operation by causing a display device and/or an audio output device provided in the component mounting machine prohibiting the pull-out operation to output a pull-out operation prohibiting warning display and/or warning sound.

* * * * *